United States Patent
Ahn et al.

(10) Patent No.: US 6,973,139 B2
(45) Date of Patent: Dec. 6, 2005

(54) BASE STATION TRANSMITTER HAVING DIGITAL PREDISTORTER AND PREDISTORTION METHOD THEREOF

(75) Inventors: Kwang-Eun Ahn, Kyungki-do (KR); Woo-Sik Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 733 days.

(21) Appl. No.: 10/023,824

(22) Filed: Dec. 21, 2001

(65) Prior Publication Data
US 2002/0080891 A1   Jun. 27, 2002

(30) Foreign Application Priority Data
Dec. 27, 2000   (KR) ............................... 2000-82908

(51) Int. Cl.$^7$ .................... H04K 1/02; H04L 25/03; H04L 25/49
(52) U.S. Cl. ................. 375/297; 327/291; 330/149; 332/106; 341/20; 341/173; 375/285; 375/295; 375/296; 375/297
(58) Field of Search .................. 330/149; 375/285, 375/296, 297, 295; 327/291; 332/106; 341/20, 341/173

(56) References Cited

U.S. PATENT DOCUMENTS

| | | | |
|---|---|---|---|
| 4,291,277 A | * | 9/1981 | Davis et al. ............... 330/149 |
| 5,148,448 A | * | 9/1992 | Karam et al. .............. 375/298 |
| 6,388,513 B1 | * | 5/2002 | Wright et al. ................. 330/2 |
| 6,775,330 B2 | * | 8/2004 | Bach et al. ................. 375/296 |
| 2002/0050372 A1 | * | 5/2002 | Lee .......................... 174/35 R |
| 2002/0171485 A1 | * | 11/2002 | Cova ......................... 330/149 |

* cited by examiner

Primary Examiner—Stephen Chin
Assistant Examiner—Erin M. File
(74) Attorney, Agent, or Firm—Fleshner & Kim, LLP (57) ABSTRACT

A base station transmitter having a digital predistorter and predistortion method is disclosed. The predistortion is accomplished by delaying a digital input signal, predistorted by a predistortion unit, for a predetermined time. A coefficient of a non-linear characteristic model of a power amplifier is generated using a digital output signal, converted from an amplified output signal of the power amplifier, and the delayed digital input signal. A reference signal is randomly generated to produce a predistortion model having a characteristic opposite to the non-linear characteristic of the power amplifier. A predistortion error function is extracted by subtracting the reference signal and the non-linear characteristic model of the power amplifier, after the produced coefficient is applied to the model. A coefficient of the predistortion unit is controlled adaptively using the predistortion error function. Thus, the present invention increases a precision of predistortion, the linearity of the base station transmitter, and the performance of a base transceiver system.

17 Claims, 8 Drawing Sheets

BASE STATION TRANSMITTER HAVING DIGITAL PREDISTORTER AND PREDISTORTION METHOD THEREOF

BACKGROUND OF THE INVENTION

1. Field of the Invention

The present invention relates to a mobile communication base transceiver system and, more particularly, to a base station transmitter having a digital predistorter and predistortion method thereof.

2. Background of the Related Art

Generally, a power amplifier of a base station transmitter amplifies a radio frequency (RF) signal and transfers the amplified RF signal to an air medium from the mobile communication base transceiver system. Thereby, the power amplifier is a dominant contributor to the non-linearity of an entire mobile communication base transceiver.

In order to improve a non-linearity of such a power amplifier, a predistortion method is widely used. The predistortion method is carried out in a manner that an input signal is predistorted opposite to a characteristic of non-linear distortion of the power amplifier. Thus, an output signal of improved linearity is attained.

Figure 1:
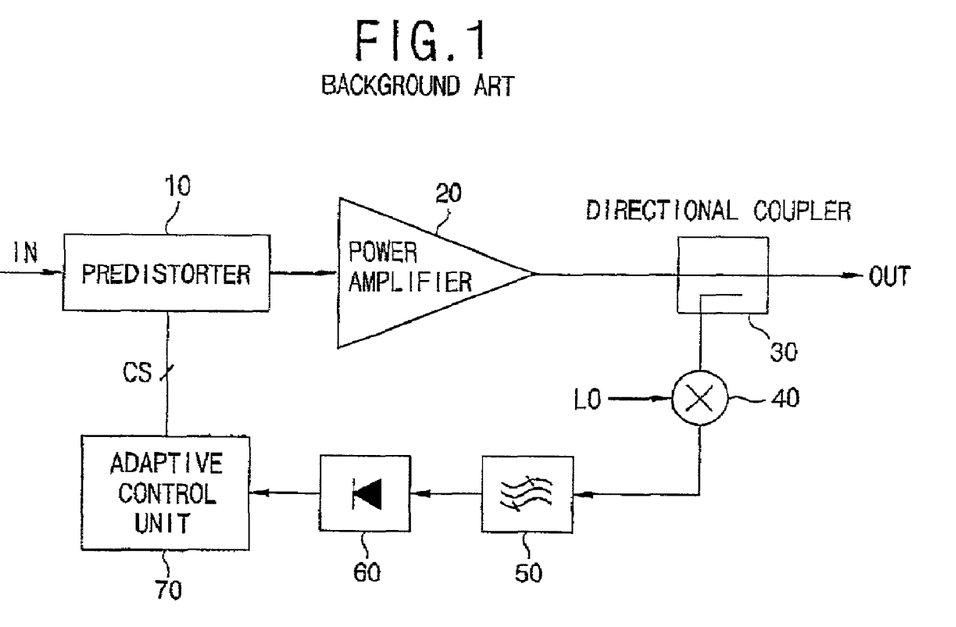
FIG. 1 illustrates a constructional diagram of a base station transmitter having a predistorter according to a background art.

FIG. 1 illustrates a constructional diagram of a base station transmitter having a predistorter according to a background art. A base station transmitter having a predistorter according to the background art includes a predistorter 10 that predistorts an input signal. A power amplifier 20 amplifies the power of the predistorted input signal received from the predistorter 10. A directional coupler 30 extracts a sampling signal from an output signal of the power amplifier 20. A mixer 40 outputs an intermediate frequency (IF) signal by mixing an output signal, extracted from the directional coupler 30, with a local oscillating signal outputted from a local oscillator (LO). A band pass filter (BPF) 50 filters a distortion component of the IF signal outputted from the mixer. A power detector 60 detects an amount of a distortion component in a signal passing through the band pass filter 50. And, an adaptive control unit 70 controls the predistorter 10, based on the amount of the distortion component detected by the power detector 60, so as to minimize the distortion component.

The operation of the above-constructed base station transmitter is explained as follows. The predistorter 10 receives an RF input signal IN, changes an amplitude and phase of the received RF input signal IN to have a characteristic opposite to a non-linear characteristic of the power amplifier 20, and outputs the changed signal to the power amplifier 20. The power amplifier 20 amplifies the power of the RF input signal outputted from the predistorter 10.

If the predistorter 10 is ideal, an output signal OUT of the power amplifier 20 produces no distortion component. Practicably though, it is impossible to make the predistorter 10 with a characteristic exactly opposite to the non-linear characteristic of the power amplifier 20. Hence, the output signal of the power amplifier 20 includes the distortion component.

Therefore, in order to minimize the distortion component appearing in the output signal OUT of the power amplifier 20, the distortion component is checked periodically and controlled for minimization. To accomplish this, the directional coupler 30 extracts a sampling signal from the output signal OUT of the power amplifier 20, the mixer 40 converts the extracted signal into the IF signal, and the band pass filter 50 extracts a distortion component from the converted IF signal. When the distortion component is extracted, the power detector 60 detects the amount of the extracted distortion component, and the adaptive control unit 70 generates a control signal based on the distortion component detected by the power detector 60 and outputs the control signal to the predistorter 10.

If the band pass filter 50 is ideal, the signal passing through the band pass filter 50 should include only the distortion component in the output signal OUT of the power amplifier 20. However, there is a limit to an attenuation characteristic of the band pass filter 50. Therefore, the input signal component is included in the output of the band pass filter 50.

In order to use the detected distortion component for the adaptive control unit 70, the original input signal component should be smaller than the distortion component by at least 15 dB. Considering that the distortion component in the output signal of the power amplifier 20 is generally smaller than the input component by 30 dB or more, the band pass filter 50 should decrease the original input signal component by at least 45 dB.

Moreover, the distortion component generated by the power amplifier 20 is mainly a $3^{rd}$ order inter-modulation distortion (IMD) component. Such an IMD component is adjacent to the output signal of the power amplifier 20 (i.e., the original input signal component to be amplified) creating difficulty in filtering.

Unfortunately, the precision of the base station transmitter predistorter, according to the background art, depends on the attenuation characteristic of the band pass filter.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Accordingly, the present invention is directed to a base station transmitter having a digital predistorter and predistortion method thereof that substantially obviate one or more problems due to limitations and disadvantages of the related art.

Another object of the present invention is to provide a base station transmitter having a digital predistorter and predistortion method thereof that improve a non-linear characteristic of a power amplifier by predistorting an input signal of the power amplifier with a digital method.

Another object of the present invention is to provide a base station transmitter having a digital predistorter and predistortion method thereof that improve a linearity of a base station transmitter and a performance of a base transceiver system by modeling a non-linear characteristic of a power amplifier, using a digital input signal and a digital signal fed back from an output of the power amplifier, and by controlling the predistortion using the characteristic model of the power amplifier.

To achieve these objects and other advantages and in accordance with the purpose of the invention, as embodied and broadly described herein, a base station transmitter having a digital predistorter according to the present invention includes a predistortion unit predistorting first and second phase digital input signals I and Q; an up-converting unit converting digital output signals of the predistortion unit into an RF signal; a power amplifier amplifying a power of the RF signal outputted from the up-converting unit; a down-converting unit converting an output signal of the power amplifier into a digital signal; a High Power Amplifier (HPA) modeling unit producing a coefficient of a non-linear characteristic model of the power amplifier using signals obtained by delaying outputs of the predistortion unit, for a predetermined time, and the digital signal outputted from the down-converting unit; a reference signal generation unit generating reference signals to produce a predistortion model; and a digital adaptive control unit extracting an error function using the reference signals and the non-linear characteristic model of the power amplifier, modeled using the produced coefficient, and controlling characteristics of the predistortion unit adaptively, using the error function.

In another aspect of the present invention, a predistortion control apparatus of a base station transmitter includes a delay unit that delays first and second phase digital input signals I and Q, sampled from outputs of the predistortion unit, in part for a predetermined time, respectively. The predistortion unit predistorts input signals to be opposite to a non-linear characteristic of a power amplifier. An HPA modeling unit produces a coefficient of a non-linear characteristic model of the power amplifier using a digital output signal, converted from an output signal of the power amplifier, and digital input signals delayed by the delay unit. A reference signal generation unit generates reference signals to generate a predistortion model. A digital adaptive control unit extracts an error function using the reference signals and the non-linear characteristic model of the power amplifier, modeled using the produced coefficient, and controls characteristics of the predistortion unit adaptively, using the error function.

In a further aspect of the present invention, a predistortion control method in a base station transmitter includes delaying a digital input signal predistorted by a predistortion unit for a predetermined time; generating a coefficient of a non-linear characteristic model of a power amplifier using a digital output signal, converted from an output signal, of which power is amplified by the power amplifier, and the delayed digital input signal; generating a reference signal randomly to produce a predistortion model having a characteristic opposite to the non-linear characteristic of the power amplifier; and extracting a predistortion error function using the reference signal and the non-linear characteristic model of the power amplifier, using the produced coefficient, and controlling a coefficient of the predistortion unit adaptively, using the predistortion error function.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 2:
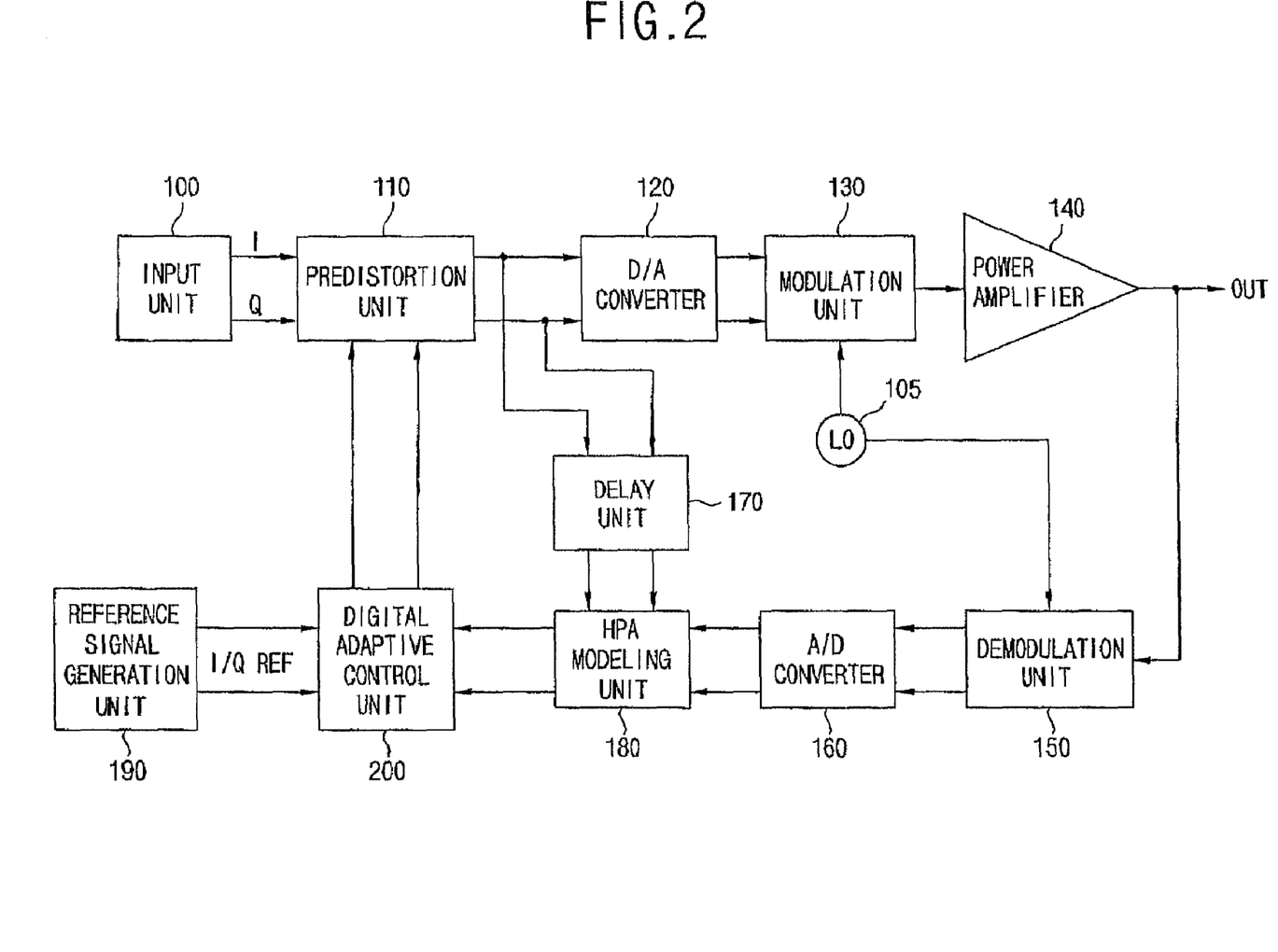
FIG. 2 illustrates a block diagram of a base station transmitter having a predistorter according to a preferred embodiment of the present invention.

FIG. 2 illustrates a block diagram of a base station transmitter having a predistorter according to a preferred embodiment of the present invention. The base station transmitter includes a predistortion unit 110 that predistorts first and second phase digital input signals (inphase signal and quadrature signal) I and Q, inputted through an input unit 100. An up-converting unit comprising a digital/analog converter 120 and a modulation unit 130 converts digital output signals of the predistortion unit 110 into an RF signal. A power amplifier (high power amplifier: HPA) 140 amplifies the power of the RF signal outputted from the up-converting unit. A down-converting unit comprising a demodulation unit 150 and an analog/digital converter 160 converts an output signal of the power amplifier 140 into a digital signal. An HPA modeling unit 180 produces a coefficient of a non-linear characteristic model of the power amplifier 140 using signals obtained by delaying outputs of the predistortion unit 110, for a predetermined time, and the digital signals outputted from the down-converting unit. A reference signal generation unit 190 generates reference signals used to generate a predistortion model. A digital adaptive control unit 200 extracts an error function using the reference signals and the non-linear characteristic model of the power amplifier 140, modeled using the produced coefficient, and controls characteristics of the predistortion unit 110 adaptively, using the error function.

The digital/analog converter 120 converts the first and second phase digital input signals I and Q, outputted from the predistortion unit 110, into analog signals, respectively. The modulation unit 130 modulates the analog input signals outputted from the digital/analog converter 120, using a local oscillating frequency obtained from LO 105, and then outputs the modulated signals to the power amplifier 140.

The demodulation unit 150 demodulates an RF output signal amplified by the power amplifier 140, using the local oscillating frequency from LO 105. The analog/digital converter 160 converts the baseband analog signals, outputted from the demodulation unit 150, into digital signals and then outputs the converted signals to the HPA modeling unit 180.

The base station transmitter further includes a delay unit 170 that delays the first and second phase digital input signals, partially sampled from the outputs of the predistortion unit 110, for a predetermined time, respectively.

The operation of the above-constructed base station transmitter is explained as follows.

Figure 5:
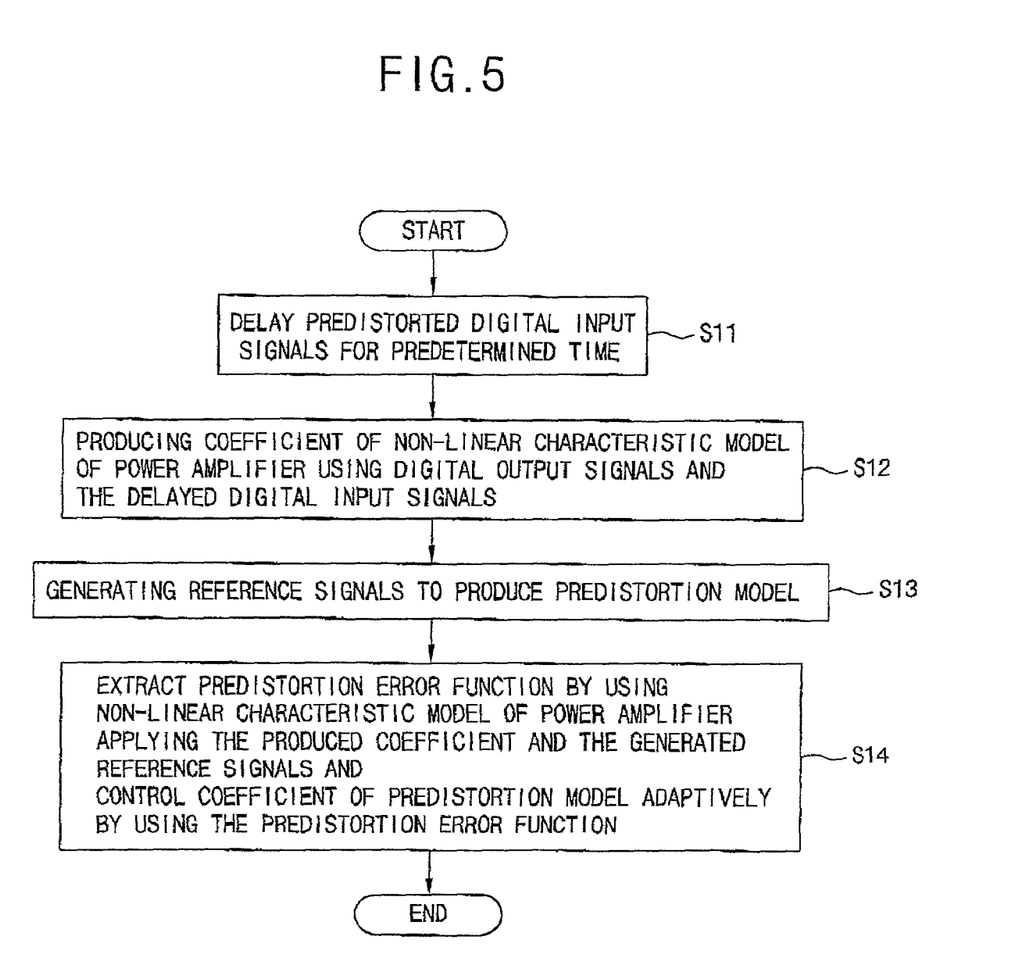
FIG. 5 illustrates a flowchart of a predistortion control method in a base station transmitter according to a preferred embodiment of the present invention.

FIG. 5 illustrates a flowchart of a predistortion control method in a base station transmitter according to a preferred embodiment of the present invention. When the first and second phase digital input signals I and Q are inputted from the input unit 100, the predistortion unit 110 predistorts the inputted signals to have a characteristic opposite to a non-linear distortion characteristic of the power amplifier 140. The digital/analog converter 120 and modulation unit 130 convert the digital output signals of the predistortion unit 110 into an RF signal and then output the RF signal to the power amplifier 140. Power amplifier 140 amplifies the power of the RF signal outputted from the modulation unit 130 to produce a final output of the base station transmitter. Demodulation unit 150 demodulates a signal extracted from the output of the power amplifier 140, and the analog/digital converter 160 converts analog signals outputted from the demodulation unit 150 into digital signals.

If the digital input signals predistorted by the predistortion unit 110 are delayed by the delay unit 170 for a predetermined time (S11), the HPA modeling unit 180 extracts an unknown coefficient of the non-linear characteristic model of the power amplifier 140, using the digital signals outputted from the analog/digital converter 160 and the delayed digital input signals, and then outputs the unknown coefficients to the digital adaptive control unit 200 (S12).

When the reference signal generation unit 190 generates the reference signals for producing the predistortion model (S13), the digital adaptive control unit 200 distorts the reference signals in accordance with the predistortion model and amplifies the distorted signals in accordance with a power amplification model, using the coefficient inputted from the HPA modeling unit 180. Thereafter, the digital adaptive control unit 200 extracts a predistortion error function, by comparing an amplitude component of the reference signals to that of the amplified signals. Then, the digital adaptive control unit 200 determines a predistortion coefficient used for the predistortion unit 110, by applying the extracted predistortion error function to the predistortion model. Thus, the digital adaptive control unit 200 controls the predistortion unit 110 adaptively by updating the predistortion coefficient (S14).

A method of adaptively controlling the predistortion in the base station transmitter is explained in the following description.

Figure 3:
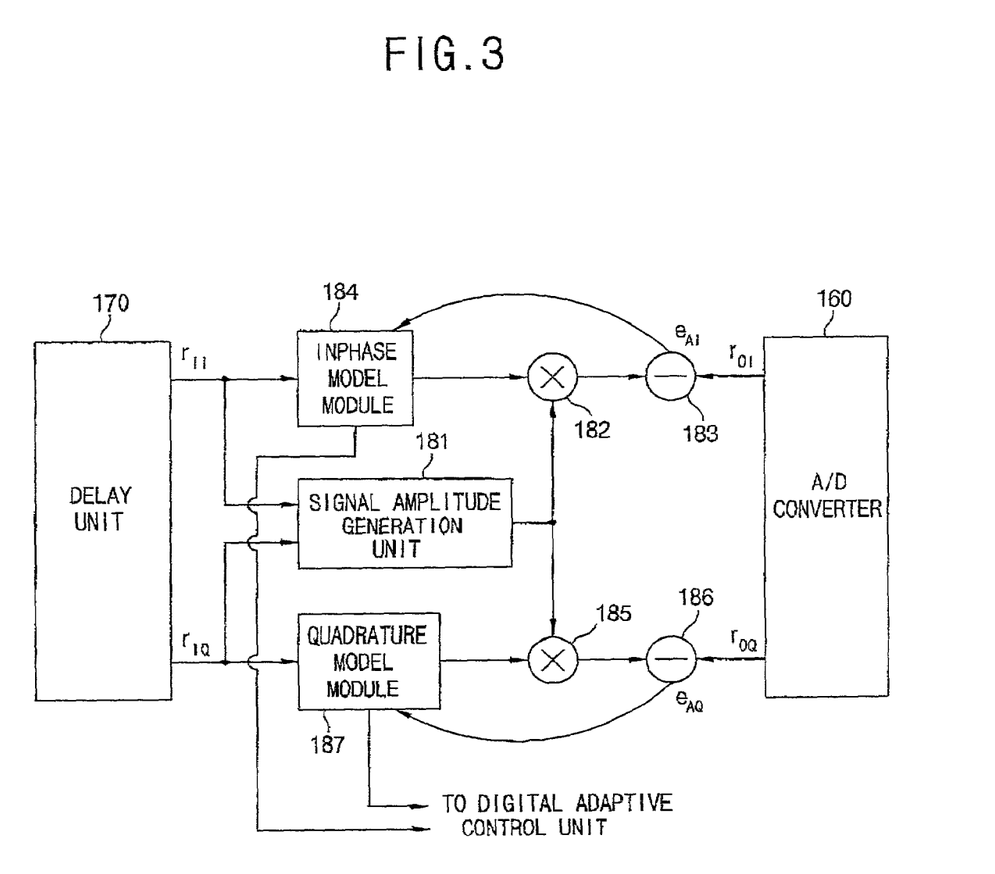
FIG. 3 illustrates a block diagram of the HPA modeling unit in FIG. 2.

FIG. 3 illustrates a block diagram of the HPA modeling unit 180 in FIG. 2. The HPA modeling unit 180 includes an in-phase coefficient generating function block 181 to 184 and a quadrature coefficient generating function block 181 and 185 to 187.

The in-phase coefficient generating function block 181 to 184 makes the first phase digital input signal I, which is outputted from the predistortion unit 110, have a predetermined amplitude. Thereafter, it extracts an HPA inphase error function $e_{AI}$ by comparing the first phase digital input signal, having the predetermined amplitude, to the first phase output signal extracted from the output of the power amplifier 140. Additionally, it extracts an unknown coefficient of an HPA inphase model using the extracted HPA inphase error function $e_{AI}$.

And, the quadrature coefficient generating function block 181 and 185 to 187 makes the second phase digital input signal Q, which is outputted from the predistortion unit 110, have a predetermined amplitude. It extracts an HPA quadrature error function $e_{AQ}$ by comparing the second phase digital input signal, having the predetermined amplitude, to the second phase output signal extracted from the output of the power amplifier 140. Additionally, it extracts an unknown coefficient of an HPA quadrature model using the extracted HPA quadrature error function $e_{AQ}$.

The construction of the HPA modeling unit 180 is explained as follows. The HPA modeling unit 180 includes a signal amplitude generation unit 181 that outputs $r_{II}$ and $r_{IQ}$ of the first and second phase digital input signals I and Q, which are delayed for a predetermined time by delay unit 170, to have the same output levels of the power amplifier 150. A first multiplier 182 multiplies an amplitude value, outputted from the signal amplitude generation unit 181, by the first phase digital input signal I, which is outputted from the delay unit 170 and passed through an inphase model module 184. A first subtracter 183 extracts the HPA inphase error function $e_{AI}$ by subtracting an output signal of the first multiplier 182 and a first phase digital signal $r_{OI}$ outputted from the analog/digital converting unit 160. An inphase model module 184 determines an unknown coefficient by applying the HPA inphase error function $e_{AI}$, outputted from the first subtracter 183, to the HPA inphase model through the recursive least square (RLS) method.

A second multiplier 185 multiplies an amplitude value, outputted from the signal amplitude generation unit 181, by the second phase digital input signal Q, which is outputted from the delay unit 170 and passed through a quadrature model module 187. A second subtracter 186 extracts the HPA quadrature error function $e_{AQ}$ by subtracting an output signal of the second multiplier 185 and a second phase digital signal $r_{OQ}$ outputted from the analog/digital converting unit 160. A quadrature model module 187 determines an unknown coefficient by applying the HPA quadrature error function $e_{AQ}$, outputted from the second subtracter 186, to the HPA quadrature model through the RLS method.

Figure 4:
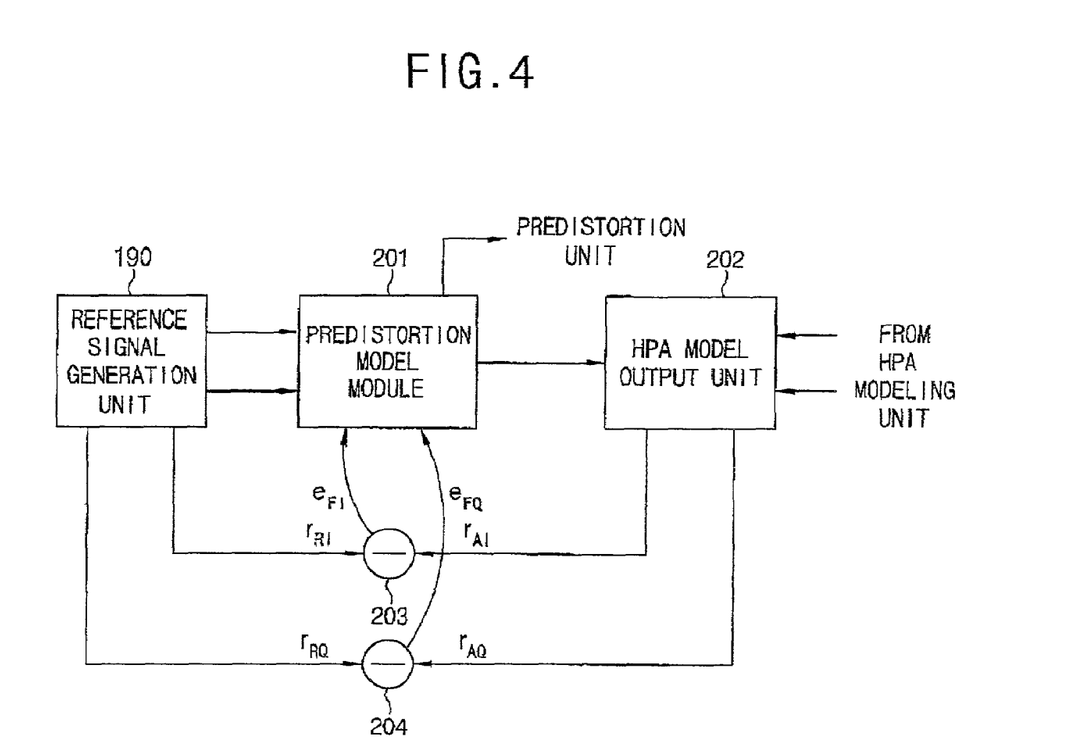
FIG. 4 illustrates a diagram of the digital adaptive control part in FIG. 2.

FIG. 4 illustrates a diagram of the digital adaptive control part in FIG. 2. The digital adaptive control unit 200 includes an HPA model output unit 202 that generates an HPA model using the HPA model value, determined by the HPA modeling unit 180. Thereafter, the HPA model output unit 202 amplifies the predistorted reference signal, which is predistorted by being applied to the predistortion model, using the HPA model. A first subtracter 203 extracts a predistortion inphase error function $e_{FI}$ by subtracting an amplitude component $r_{RI}$ of the first phase reference signal, generated from the reference signal generation unit 190, and an output amplitude component $r_{AI}$ of the HPA model output unit 202. A second subtracter 204 extracts a predistortion quadrature error function $e_{FQ}$ by subtracting an amplitude component $r_{RQ}$ of the second phase reference signal, generated from the reference signal generation unit 190, and an output amplitude component $r_{AQ}$ of the HPA model output unit 202. A predistortion model module 201 predistorts the reference signal generated from the reference signal generation unit 190, using the predistortion model, to output the predistorted reference signal to the HPA model output unit 202. Additionally, the predistortion model module 201 updates the predistortion coefficient of the predistortion unit 110 by applying the error functions extracted respectively from the first and second subtracters 203 and 204 to the predistortion model, through the LMS algorithm.

The signal amplitude generation unit 181 of the above-constructed HPA modeling unit 180 amplifies the amplitudes $r_{II}$ and $r_{IQ}$ of the first and second phase digital input signals I and Q, which are outputted from the predistortion unit 110 and delayed for a predetermined time by the delay unit 170, to have the same amplitude as the output level of the power amplifier 140.

The first multiplier 182 multiplies the first phase digital input signal, which was outputted from the delay unit 170 and passed through the inphase model module 184, by the signal value outputted from the signal amplitude generation unit 181. And, the first subtracter 183 carries out a subtracting operation on an output of the first multiplier 182 and an output $r_{OI}$ of the analog/digital converter 160 to extract the HPA inphase error function $e_{AI}$. The inphase model module 184 then determines the unknown coefficient by applying the extracted HPA inphase error function $e_{AI}$ to the HPA inphase model through the RLS method.

The second multiplier 185 multiplies the second phase digital input signal, which was outputted from the delay unit 170 and passed through the quadrature phase model module 187, by the signal value outputted from the signal amplitude generation unit 181. And, the second subtracter 186 carries out a subtracting operation on an output of the second multiplier 185 and an output $r_{OQ}$ of the analog/digital converter 160 to extract the HPA quadrature phase error function $e_{AQ}$. The quadrature phase model module 187 then determines the unknown coefficient by applying the extracted HPA quadrature phase error function $e_{AQ}$ to the HPA quadrature phase model through the RLS method.

When the unknown coefficients of the HPA model are determined by the HPA modeling unit 180, the digital adaptive control unit 200 determines the predistortion coefficients to be used for the predistortion unit 110 using the reference signals generated from the reference signal generation unit 190.

An adaptive predistortion control method in the digital adaptive control unit 200 is explained in the following description.

When the predistortion coefficient varying the characteristic of the predistortion unit 110 is updated, the input signal inputted to the power amplifier may be used as it is. Instead, the reference signals generated from the reference signal generation unit 190 are used in the present invention. The reference signal generation unit 190 randomly generates the reference signals, to be used as inputs of the predistortion model, in a range of signals that may be inputted to the power amplifier 140.

The reference signals generated from the reference signal generation unit 190 are inputted into the predistortion model module 201 and applied to the previously-realized predistortion model as a function of a polynomial expression, so as to attenuate the distortion component. The HPA model output unit 202 produces the HPA model as a function of a polynomial expression using the HPA model coefficients provided by the HPA modeling unit 180. And, the HPA model output unit 202 receives the distortion component attenuated by the predistortion model module 201 and then amplifies the distortion component through the HPA model. The HPA model is also represented by a function of a polynomial expression, as is the predistortion model.

The least mean square ELMS) algorithm is used when the predistortion coefficient is updated by the digital adaptive control unit 200. Thus, the first and second subtracters 203 and 204 output the predistortion error functions $e_{FI}$ and $e_{FQ}$ by subtracting the amplitude components $r_{RI}$ and $r_{RQ}$ of the reference signals, generated from the reference signal generation unit 190, and the amplitude components $r_{AI}$ and $r_{AQ}$ of the signals amplified by the HPA model output unit 202, respectively.

The predistortion model module 201 determines the unknown coefficients included in the predistortion model by applying the predistortion error functions to the predistortion model through the LMS method. Namely, in the case of the inphase signal, the unknown coefficient included in the predistortion model is determined by the following Formula 1.

[Formula 1]

$$P_{I,n}(k) = P_{I,n-1}(k) + \alpha^* e_{FI}(n)^* (r_{RI})^k$$

In Formula 1, '$P_{I,n}(k)$' is an unknown coefficient of a kth polynominal of the predistortion model for an $n^{th}$ iteration and '$\alpha$' means an adaptation step in LMS.

In the case of the quadrature signal, the unknown coefficient included in the predistortion model is determined by the same method of Formula 1.

Thus, the digital adaptive control unit 200 provides the predistortion unit 110 with the unknown coefficients updated adaptively. Therefore, the predistortion unit 110 is provided the characteristic opposite to the non-linear characteristic of the power amplifier 140, so that the base station transmitter produces the linear output signal.

Figure 6A:
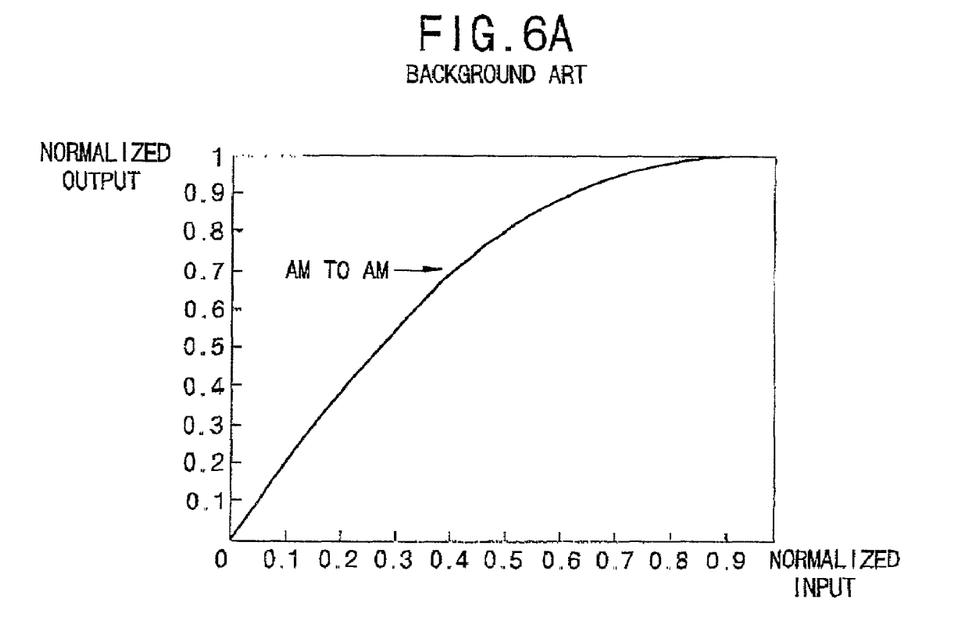
FIG. 6A illustrates a graph modeling a non-linear characteristic of a general power amplifier for AM to AM, as a 7th order polynomial expression.
Figure 6B:
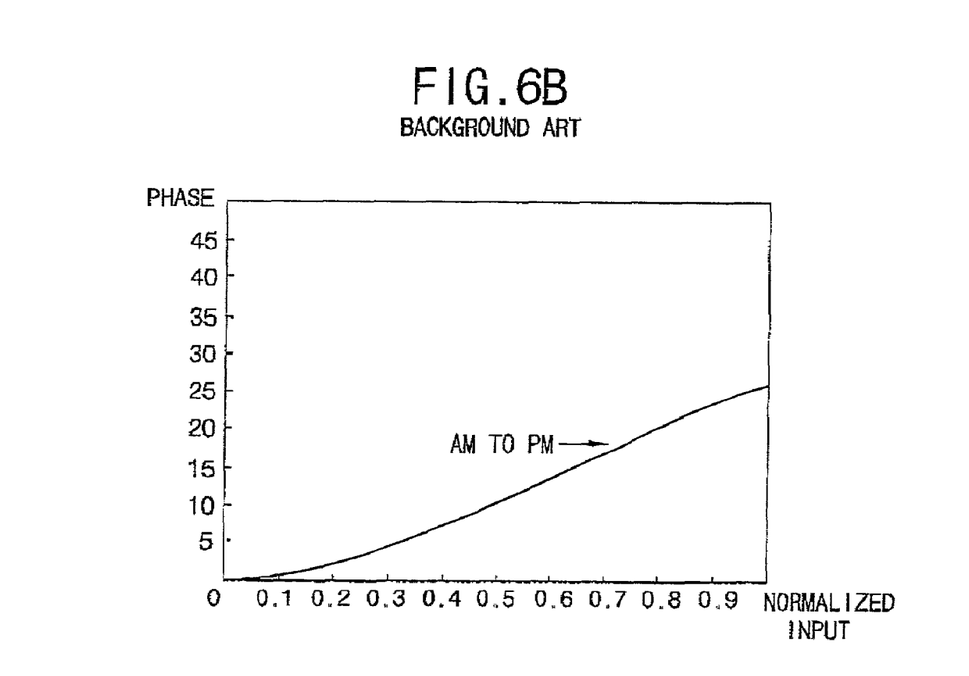
FIG. 6B illustrates a graph modeling a non-linear characteristic of a general power amplifier for AM to PM, as a 7th order polynomial expression.

FIG. 6A illustrates a graph modeling a non-linear characteristic of a general power amplifier for amplitude modulation to amplitude modulation (AM to AM), as a 7th order polynomial expression. FIG. 6B illustrates a graph modeling a non-linear characteristic of a general power amplifier for AM to phase modulation (PM), as a 7th order polynomial expression. By examination, it may be seen that they accord with the Saleh model, which is hereby incorporated by reference.

In this case, it is assumed that 60 input signal samples are used for determining the unknown coefficients, a gain of the predistortion unit is set up as '1', and there is no phase delay. An amplitude error within a normalized input signal range is under $10^{-3}$ and a phase error is under $10^{-2}$ Radian.

Figure 7A:
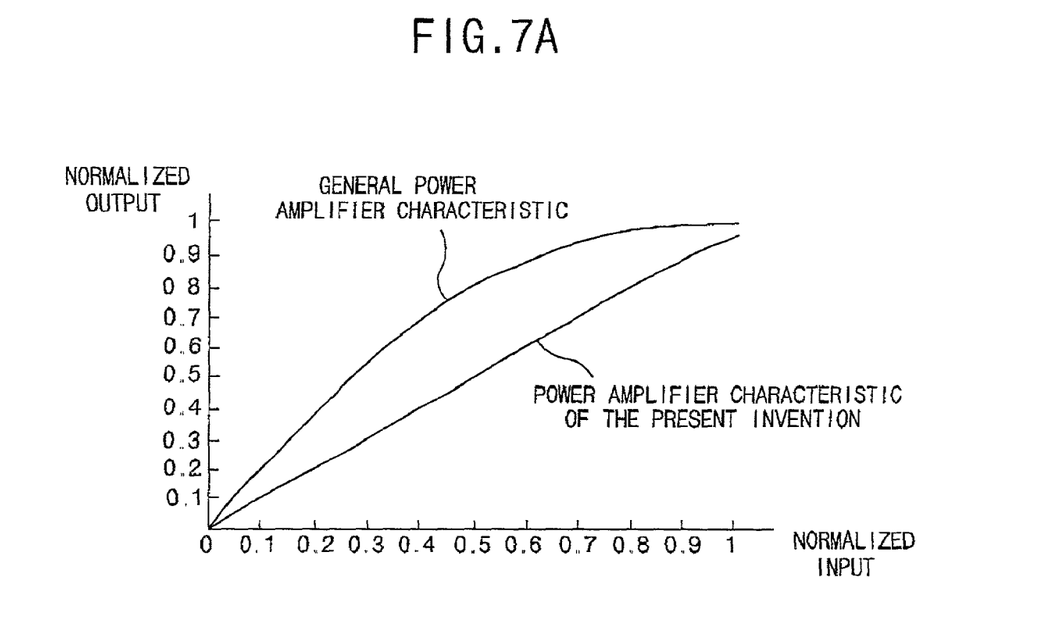
FIG. 7A illustrates a graph modeling a characteristic of an amplifier for AM to AM, having a digital predistorter according to a preferred embodiment of the present invention.
Figure 7B:
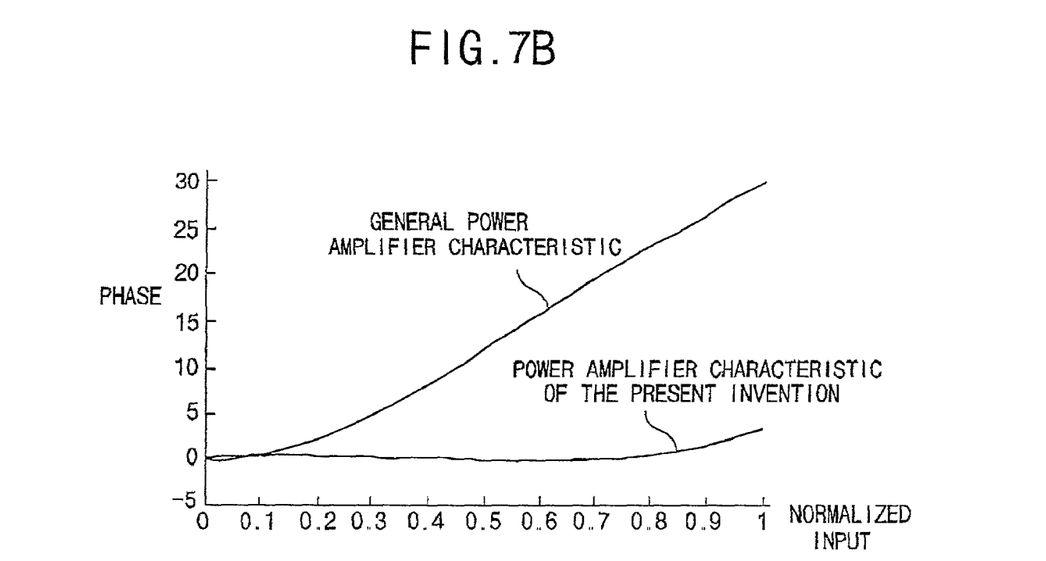
FIG. 7B illustrates a graph modeling a characteristic of a amplifier for AM to PM, having a digital predistorter according to a preferred embodiment of the present invention.

FIG. 7A illustrates a graph modeling a characteristic of an amplifier for AM to AM having a digital predistorter according to a preferred embodiment of the present invention. FIG. 7B illustrates a graph modeling a characteristic of an amplifier for AM to PM having a digital predistorter according to a preferred embodiment of the present invention. In this case, a model of a digital predistorter is embodied as a fifth-order polynomial expression.

A general power amplifier characteristic for AM to AM, shown in FIG. 6A, teaches that an amplitude of an output signal of the power amplifier is attenuated (i.e., distorted) in accordance with an amplitude of an input signal. On the contrary, the power amplifier characteristic, as shown in FIG. 7A, to which the present invention is applied, teaches that an amplitude of an output signal is linearly amplified in accordance with an amplitude of an input signal.

Moreover, a general power amplifier characteristic for AM to PM, shown in FIG. 6B, teaches that an amplitude of an output signal of the power amplifier is attenuated (i.e., distorted) in accordance with an amplitude of an input signal. On the contrary, the power amplifier characteristic, as shown in FIG. 7B, to which the present invention is applied, teaches that a phase is uniform regardless of an amplitude of an input signal. Hence, characteristics of AM to AM and AM to PM of the power amplifier to which the present invention is applied are improved.

Figure 8:
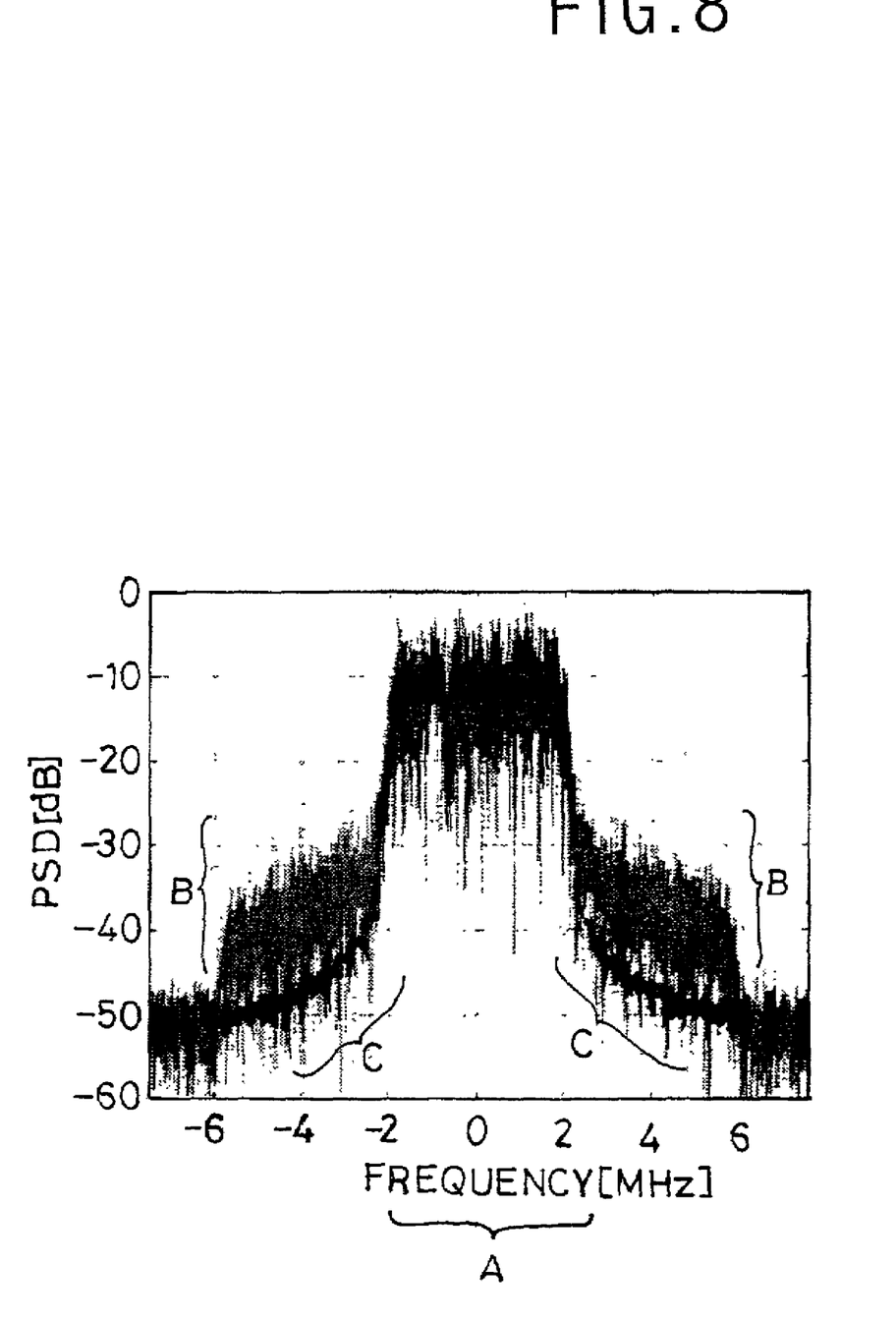
FIG. 8 illustrates a graph of a predistortion characteristic in accordance with an application of a digital predistorter according to a preferred embodiment of the present invention.

FIG. 8 illustrates a graph of a predistortion characteristic in accordance with an application of a digital predistorter, according to a preferred embodiment of the present invention. 'A', 'B', and 'C' indicate a signal band, a third order distortion component of a general power amplifier, and a third order distortion component of the power amplifier to which the digital predistorter according to the present invention is applied, respectively. The present invention, as is the case of 'C', minimizes the effect on other adjacent channels by leaving the distortion component far from the signal band.

Accordingly, in a base station transmitter having a digital predistorter and predistortion method thereof according to the present invention, a real-time modeling is carried out on a non-linear characteristic of a power amplifier using a digital input signal and a digital signal fed back from an output of the power amplifier. The predistortion is controlled adaptively using a characteristic model of the modeled power amplifier. Thus, a precision of predistortion is increased so as to improve the linearity of the base station transmitter and performance of a base transceiver system.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A base station transmitter, comprising:
   a predistortion unit that predistorts first and second phase digital input signals I (In-phase) and Q (Quadrature);
   an up-converting unit that converts digital output signals of the predistortion unit into an RF (Radio Frequency) signal;
   a power amplifier that amplifies a power of the RF signal outputted from the up-converting unit;
   a down-converting unit that converts an output signal of the power amplifier into a digital signal;
   a High Power Amplifier (HPA) modeling unit that produces a coefficient of a non-linear characteristic model of the power amplifier using signals obtained by delaying outputs of the predistortion unit for a predetermined time and the digital signal outputted from the down-converting unit;
   a reference signal generation unit that generates reference signals independent of the first and second phase digital input signals I and Q to produce a predistortion model; and
   a digital adaptive control unit that extracts an error function using the reference signals and the produced coefficient, wherein
   the digital adaptive control unit controls characteristics of the predistortion unit adaptively using the error function.

2. The transmitter of claim 1, wherein the up-converting unit comprises;
   a digital/analog converter that converts the predistorted first and second phase digital input signals I and Q into analog signals, respectively; and
   a modulation unit that modulates the analog signals outputted from the digital/analog converter and outputs the modulated analog signals to the power amplifier as the RF signal.

3. The transmitter of claim 1, wherein the down-converting unit comprises:
   a demodulation unit that demodulates a signal sampled from the RF signal amplified by the power amplifier; and
   an analog/digital converter that converts an analog signal, outputted from the demodulation unit, to the digital signal and outputs the digital signal to the HPA modeling unit.

4. The transmitter of claim 1, wherein the HPA modeling unit comprises:
   an inphase coefficient generating function block that makes the predistorted first phase digital input signal I, which is outputted from the predistortion unit, have a first predetermined amplitude, extracts an HPA inphase error function by comparing the predistorted first phase digital input signal I to a first phase output signal I extracted from the output signal of the power amplifier, and extracts an unknown coefficient of an HPA inphase model using the extracted HPA inphase error function; and
   a quadrature coefficient generating function block that makes the predistorted second phase digital input signal Q, which is outputted from the predistortion unit, have a second predetermined amplitude, extracts an HPA quadrature error function by comparing the predistorted second phase digital input signal Q to a second phase output signal Q extracted from the output signal of the power amplifier, and extracts an unknown coefficient of an HPA quadrature model using the extracted HPA quadrature error function.

5. The transmitter of claim 1, wherein the HPA modeling unit comprises:
   a signal amplitude generation unit that outputs an amplitude value of the predistorted first and second phase digital input signals I and Q, which are delayed for the predetermined time by a delay unit, to have the same output level as the power amplifier;
   a first multiplier that multiplies the amplitude value outputted from the signal amplitude generation unit by the predistored first phase digital input signal I, after the predistorted first phase digital input signal I passes through the delay unit and an HPA inphase model module;
   a first subtracter that extracts an HPA inphase error function by subtracting an output signal of the first multiplier and a first phase digital signal I outputted form the down-converting unit;
   a second multiplier that multiplies the amplitude value outputted from the signal amplitude generation unit by the predistorted second phase digital input signal Q, after the predistorted second phase digital input signal Q passes through the delay unit and an HPA quadrature model module; and
   a second subtracter that extracts an HPA quadrature error function by subtracting an output signal of the second multiplier and a second phase digital signal Q outputted from the down-converting unit, wherein
   the inphase model module determines an unknown coefficient I by applying the HPA inphase error function to an HPA inphase model through a Recursive Least Square (RLS) method, and
   the quadrature model module determines an unknown coefficient Q by applying the HPA quadrature error function to an HPA quadrature model through the RLS method.

6. The transmitter of claim 1, wherein the digital adaptive control unit comprises:

an HPA model output unit that generates an HPA model by applying the coefficient produced by the HPA modeling unit and amplifies the reference signals that are predistorted by the predistortion model using the HPA model;

a first subtracter that extracts a predistortion inphase error function by subtracting an amplitude component of a first phase reference signal, generated by the reference signal generation unit, and an output amplitude component I of the HPA model output unit;

a second subtracter that extracts a predistortion quadrature error function by subtracting an amplitude component of a second phase reference signal, generated by the reference signal generation unit, and an output amplitude component Q of the HPA model output unit; and a predistortion model module that predistorts the reference signals, generated from the reference signal generation unit, using the predistortion model to output predistorted reference signals to the HPA model output unit and updates predistortion coefficients of the predistortion unit by applying the inphase and quadrature error functions extracted, respectively, by the first and second subtracters to the predistortion model.

7. A base station transmitter, comprising:

a predistortion unit that predistorts first and second phase digital input signals;

a digital/analog converter that converts the first and second phase digital input signals into analog signals, respectively;

a modulation unit that modulates the analog signals outputted from the digital/analog converter and outputs the modulated analog signals as RF signals;

a power amplifier that amplifies the power of the RF signals outputted from the modulation unit;

a demodulation unit that demodulates a signal sampled from the RF signals amplified by the power amplifier;

an analog/digital converter that converts analog signals outputted from the demodulation unit;

a delay unit that delays the predistorted first and second phase digital input signals, sampled from outputs of the predistortion unit, for a predetermined time;

an HPA modeling unit that produces a coefficient of a non-linear characteristic model of the power amplifier using digital signals outputted from the analog/digital converter and output signals of the delay unit;

a reference signal generation unit that generates reference signals independent of the first and second phase digital input signals to produce a predistortion model; and a digital adaptive control unit that extracts an error function using the reference signals and the non-linear characteristic model of the power amplifier, modeled using the produced coefficient, and controls characteristics of the predistortion unit adaptively, using the error function.

8. The transmitter of claim 7, wherein the HPA modeling unit comprises:

an inphase coefficient generating function block that makes the predistorted first phase digital input signal, which is outputted from the predistortion unit, have a first predetermined amplitude, extracts an HPA inphase error function by comparing the predistorted first phase digital input signal to a first phase output signal extracted from an output of the power amplifier, and extracts an unknown coefficient I of an HPA inphase model using the extracted HPA inphase error function; and a quadrature coefficient generating function block that makes the predistorted second phase digital input signal, which is outputted from the predistortion unit, have a second predetermined amplitude, extracts an HPA quadrature error function by comparing the predistorted second phase digital input signal to a second phase output signal extracted from the output of the power amplifier, and extracts an unknown coefficient Q of an HPA quadrature model using the extracted HPA quadrature error function.

9. The transmitter of claim 7, wherein the HPA modeling unit comprises:

a signal amplitude generation unit that outputs an amplitude value of the predistorted first and second phase digital input signals, which are delayed for the predetermined time by the delay unit, to have the same output level as the power amplifier;

a first amplifier that multiplies the amplitude value outputted from the signal amplitude generation unit by the predistorted first phase digital input signal, after the predistorted first phase digital signal passes through the delay unit and an inphase model module;

a first subtracter that extracts an HPA inphase error function by subtracting an output signal of the first multiplier and a first phase digital signal outputted from the analog/digital converter;

a second multiplier that multiplies the amplitude value outputted from the signal amplitude generation unit by the predistorted second phase digital input signal, after the predistorted second phase input signal passes through the delay unit and a quadrature model module; and a second subtracter that extracts an HPA quadrature error function by subtracting an output signal of the second multiplier and a second phase digital signal outputted from the analog/digital converter; wherein the inphase model module determines an unknown coefficient I by applying the HPA inphase error function to an HPA inphase model through a recursive least square (RLS) method, and the quadrature model module determines an unknown coefficient Q by applying the HPA quadrature error function to an HPA quadrature model through the RLS method.

10. The transmitter of claim 7, wherein the digital adaptive control unit comprises:

an HPA model output unit that generates an HPA model, using the coefficient produced by the HPA modeling unit, and amplifies the reference signals, after the reference signals are predistorted by the predistortion model, using the HPA model;

a first subtracter that extracts a predistortion inphase error function by subtracting an amplitude component of a first phase reference signal, generated by the reference signal generation unit, and a first output amplitude component of the HPA model output unit;

a second subtracter that extracts a predistortion quadrature error function by subtracting an amplitude component of a second phase reference signal, generated by the reference signal generation unit, and a second output amplitude component of the HPA model output unit; and a predistortion model module that predistorts the reference signals, generated from the reference signal generation unit, using the predistortion model to output predistorted reference signals to the HPA model output unit and updates predistortion coefficients of the predistortion unit by applying the inphase and quadrature error functions extracted from the first and second subtracters, respectively, to the predistortion model.

11. A predistortion control apparatus, comprising:
a predistortion unit that predistorts input signals to be opposite to a non-linear characteristic of a power amplifier and outputs predistorted first and second phase digital input signals;
a high power amplifier (HPA) modeling unit that produces a coefficient of a non-linear characteristic model of the power amplifier using a digital output signal, converted from an output signal of the power amplifier, and the predistorted first and second phase digital input signals;
a digital adaptive control unit that extracts an error function using reference signals and the non-linear characteristic model of the power amplifier, modeled using the produced coefficient, and controls characteristics of the predistortion unit adaptively, using the error function; and
a delay unit that delays the predistorted first and second phase digital input signals, sampled from outputs of the predistortion unit for a predetermined time, before the respective signals are communicated to the HPA modeling unit; and
a reference signal generation unit that generates the reference signal used to produce a predistortion model independent of the first and second phase digital input signals.

12. The apparatus of claim 11, wherein the HPA modeling unit comprises:
an inphase coefficient generating function block that makes the predistorted first phase digital input signal, which is outputted from the predistortion unit, have a first predetermined amplitude, extracts an HPA inphase error function by comparing the predistorted first phase digital input signal to a first phase output signal extracted from the output signal of the power amplifier, and extracts an unknown coefficient of an HPA inphase model using the extracted HPA inphase error function; and
a quadrature coefficient generating function block that makes the predistorted second phase digital input signal, which is outputted from the predistortion unit, have a second predetermined amplitude, extracts an HPA quadrature error function by comparing the predistorted second phase digital input signal to a second phase output signal extracted from the output signal of the power amplifier, and extracts an unknown coefficient of an HPA quadrature model using the extracted HPA quadrature error function.

13. The apparatus of claim 11, wherein the HPA modeling unit comprises:
a signal amplitude generation unit that outputs an amplitude value of the predistorted first and second phase digital input signals, which are delayed for the predetermined time by the delay unit, to have the same output level as the power amplifier;
a first multiplier that multiplies the amplitude value outputted from the signal amplitude generation unit by the predistorted first phase digital input signal, after the predistorted first phase digital input signal is passed through the delay unit and an inphase model module;
a first subtracter that extracts an HPA inphase error function by subtracting an output signal of the first multiplier and a first phase digital signal converted from the output signal of the power amplifier;
a second multiplier that multiplies the amplitude value outputted from the signal amplitude generation unit by the predistorted second phase digital input signal, after the predistorted second phase digital input signal passes through the delay unit and a quadrature model module, and
a second substracter that extracts an HPA quadrature error function by subtracting an output signal of the second multiplier and a second phase digital signal converted from the output signal of the power amplifier, wherein
the inphase model module determines an unknown coefficient I by applying the HPA inphase error function to an HPA inphase model, and
the quadrature model module determines an unknown coefficient Q by applying the HPA quadrature error function to an HPA quadrature model.

14. The apparatus of claim 11, wherein the digital adaptive control unit comprises:
an HPA model output unit that generates an HPA model, using the coefficient produced by the HPA modeling unit, and amplifies the reference signals, after the reference signals are predistorted by the predistorted model, using the HPA model;
a first subtracter that extracts a predistortion inphase error function by subtracting an amplitude component of a first phase reference signal, generated by the reference signal generation unit, and an output amplitude component I of the HPA model output unit;
a second subtracter that extracts a predistortion quadrature error function by subtracting an amplitude component of a second phase reference signal, generated by the reference signal generation unit, and an output amplitude component Q of the HPA model output unit; and
a predistortion model module that predistorts the reference signals, generated from the reference signal generation unit, using the predistortion model, outputs the predistorted reference signals to the HPA model output unit, and updates predistortion coefficients of the predistortion unit by applying the predistortion inphase and quadrature error functions extracted from the first and second subtracters, respectively, to the predistortion model.

15. A predistortion control method, comprising:
delaying a digital input signal including predistorted first and second phase digital input signals, predistorted by a predistortion unit, for a predetermined time;
generating a first coefficient of a non-linear characteristic model of a power amplifier using a digital output signal, converted from an amplified output signal of the power amplifier, and the delayed digital input signal;
generating a substantially random reference signal independent of the first and second phase digital input signals;
producing a predistortion model having a characteristic opposite to a non-linear characteristic of the power amplifier using the random reference signal;
generating the non-linear characteristic model of the power amplifier using the first coefficient;
extracting a predistortion error function by subtracting the reference signal from the non-linear characteristic model of the power amplifier; and
controlling a second coefficient of the predistortion unit adaptively using the predistortion error function.

16. The method of claim 15, wherein generating the first coefficient comprises:
outputting an amplitude of the predistorted digital input signal to have the same amplification level as the power amplifier;

multiplying the predistorted digital input signal by the outputted amplitude;

extracting an HPA error function by comparing a product of the multiplication to the digital output signal; and generating the first coefficient by applying the extracted HPA error function to the non-linear characteristic model of the power amplifier through a recursive least squares (RLS) method.

17. The method of claim 15, wherein controlling the second coefficient of the predistortion unit adaptively comprises:

generating the non-linear characteristic model of the power amplifier using the generated first coefficient;

predistorting the reference signal using the predistortion model and amplifying the predistorted reference signal using the generated non-linear characteristic model of the power amplifier;

extracting the predistortion error function by comparing an amplitude component of the reference signal to an amplitude component of the amplified and predistorted reference signal; and updating the second coefficient of the predistortion unit adaptively by applying the extracted predistortion error function to the predistortion model.

* * * * *